United States Patent
Deligiannis

(10) Patent No.: US 7,504,972 B2
(45) Date of Patent: Mar. 17, 2009

(54) METHOD FOR INCREASING THE RESOLUTION OF ANALOG TO DIGITAL CONVERSION

(75) Inventor: Jorge Deligiannis, Ottawa (CA)

(73) Assignee: Energate Inc., Ottawa (CA)

( * ) Notice: Subject to any disclaimer, the term of this patent is extended or adjusted under 35 U.S.C. 154(b) by 0 days.

(21) Appl. No.: 11/755,701

(22) Filed: May 30, 2007

(65) Prior Publication Data
US 2007/0279258 A1 Dec. 6, 2007

Related U.S. Application Data

(60) Provisional application No. 60/803,404, filed on May 30, 2006.

(51) Int. Cl.
*H03M 1/20* (2006.01)
(52) U.S. Cl. .................. 341/131; 341/126
(58) Field of Classification Search .......... 341/131–155
See application file for complete search history.

(56) References Cited

U.S. PATENT DOCUMENTS 6,404,080 B1 * 6/2002 Sanders et al. .............. 307/125
6,744,376 B1 * 6/2004 Pascalidis .............. 340/870.21
7,245,512 B2 * 7/2007 Leung et al. .................. 363/95

* cited by examiner

*Primary Examiner*—Lam T Mai
(74) *Attorney, Agent, or Firm*—Vincent Patent Agency

(57) ABSTRACT

A method for increasing the resolution of analog to digital conversion made by a microcontroller. A resistive-capacitive network is connected between an input/output port of the microcontroller and a sense voltage to be converted. The sense voltage is measured (i.e. converted) using the port in input mode to obtain a nominal voltage. The port is then switched to output mode and driven high (or alternatively low) for a period of time to modify the sense voltage by an amount equal to a desired fractional resolution step size. The port is switched back to input mode and the modified voltage is measured. The steps of driving the port in output mode and measuring the modified voltage can be repeated with the modification to the sense voltage increasing in successively larger multiples of the desired fractional resolution step size. In one embodiment of the method, the successive measurements can be summed to give the converted original sense voltage expressed in fractional resolution step size.

6 Claims, 6 Drawing Sheets

Figure 3A                    Figure 3B
Figure 3C                    Figure 3D

METHOD FOR INCREASING THE RESOLUTION OF ANALOG TO DIGITAL CONVERSION

CROSS-REFERENCE TO RELATED APPLICATIONS

This application claims priority from U.S. Provisional Patent Application Ser. No. 60/803,404 filed May 30, 2006, the entirety of which is incorporated herein by reference.

FIELD OF INVENTION

The present invention relates to the field of analog to digital conversion. In particular, to a method for increasing the resolution of analog to digital conversion.

BACKGROUND

Most microcontrollers incorporate analog to digital (A/D) converters with 8-10 bits of resolution, which is not sufficient resolution for certain applications. Typical alternatives require significant additional circuitry to achieve higher resolution or the use of extra microcontroller resources beyond the built-in A/D converter. The simplest solution to this problem is to use a high-resolution A/D converter separate from the microcontroller. This adds complexity (e.g. requires a data bus) and cost to a circuit.

Another common method used to attempt to address this problem is to sample the signal many times with the A/D converter and average the results. In practice, however, because a signal that is in between two adjacent A/D converter resolution steps will be measured as either one or the other, it is only when the signal is almost exactly between steps that an intermediate value will result from this over-sampling method. This method therefore fails to adequately resolve small changes in the signal.

Another method is to implement a circuit that generates a voltage ramp. The ramp is then fed into one half of a comparator input on the microcontroller and the signal being measured is fed into the other half of the comparator input. By knowing the shape of the ramp and measuring the time from the start of the ramp to when the comparator output changes, a higher resolution measurement can be achieved. The maximum achievable resolution with this method depends on the precision of the microcontroller timers and the period of the ramp. This method does not have a significant impact on circuit cost, but uses substantially more microcontroller resources (extra ports, a timer, etc.) and can increase conversion times.

SUMMARY OF INVENTION

A method for increasing the resolution of analog to digital conversion made by a microcontroller. According to the method a resistive-capacitive (RC) network is connected between an input/output (I/O) port of the microcontroller and a sense voltage to be converted. The sense voltage is measured (i.e. converted to digital form) using the port in input mode to obtain a nominal voltage. The port is then switched to output mode and driven high (or alternatively low) for a period of time, $T_1$, to modify the sense voltage by an amount equal to a desired fractional resolution step size. After time $T_1$, the port is switched back to input mode and the modified sense voltage is measured (i.e. converted). The steps of driving the port in output mode and measuring the sense voltage can be repeated with the modification to the sense voltage increasing (or alternatively decreasing) in successively larger multiples of the desired fractional resolution step size. In one embodiment of the method, the successive measurements can be summed to give the converted original sense voltage expressed in fractional resolution step size.

In accordance with an aspect of the invention there is provided, a method for increasing the resolution of an analog to digital conversion, using a microcontroller having an analog to digital converter and a configurable input/output port, a sense voltage to be converted is presented to the input/output port through a resistive-capacitive network, the resolution is increased to a desired resolution step size $\Delta_C$ equal to a fraction 1/N of the native resolution step size of the analog to digital converter, the method comprising the steps of: measuring the sense voltage with the port configured for input and assigning the measured value to $M_1$; repeating for K=1 to N−1 the steps of: modifying the sense voltage by driving the port to a high voltage, with the port configured for output, for a period of time determined to modify the sense voltage by an amount equal to K times the desired resolution step size $\Delta_C$; measuring the modified voltage with the port configured for input and assigning the measured value to $M_{K+1}$; comparing $M_{K+1}$ with $M_K$; continuing to repeat the steps when $M_{K+1} = M_K$; and ending the repeating of the steps when $M_{K+1}$ is not equal to $M_K$; wherein the resulting value of the conversion is equal to $M_1$ when all measurements $M_1$ to $M_N$ are equal; and the resulting value of the conversion is equal to $M_1 + (N-K) \Delta_C$ when $M_{K+1}$ is not equal to $M_K$.

In accordance with another aspect of the invention there is provided, a method for increasing the resolution of an analog to digital conversion, using a microcontroller having an analog to digital converter and a configurable input/output port, a sense voltage to be converted is presented to the input/output port through a resistive-capacitive network, the resolution is increased to a desired resolution step size $\Delta_C$ equal to a fraction 1/N of the native resolution step size of the analog to digital converter, the method comprising the steps of: measuring the sense voltage with the port configured for input and assigning the measured value to $M_1$; repeating for K=1 to N−1 the steps of: modifying the sense voltage by driving the port to a high voltage, with the port configured for output, for a period of time determined to modify the sense voltage by an amount equal to K times the desired resolution step size; measuring the modified voltage with the port configured for input and assigning the measured value to $M_{K+1}$; wherein the resulting value of the conversion is equal to $\Sigma(M_1 \text{ to } M_N)/N$.

In accordance with a further aspect of the invention there is provided, a method for increasing the resolution of an analog to digital conversion, using a microcontroller having an analog to digital converter and a configurable input/output port, a sense voltage to be converted is presented to the input/output port through a resistive-capacitive network, the resolution is increased to a desired resolution step size $\Delta_C$ equal to a fraction i/N of the native resolution step size of the analog to digital converter, the method comprising the steps of: measuring the sense voltage with the port configured for input and assigning the measured value to $M_1$; determining that $M_1$ is one of: less than or equal to a mid-point of the analog to digital converter operating range; and greater than the mid-point of the analog to digital converter operating range; repeating for K=1 to N−1 the steps of: when $M_1$ is less than or equal to the mid-point of the analog to digital converter operating range, modifying the sense voltage by driving the port to a high voltage, with the port configured for output, for a period of time determined to modify the sense voltage by an amount equal to K times the desired resolution step size $\Delta_C$; when $M_1$ is greater than the mid-point of the analog to digital converter operating range, modifying the sense voltage by driving the port to a low voltage, with the port configured for output, for a period of time determined to modify the sense voltage by an amount equal to K times the desired resolution step size $\Delta_C$; measuring the modified voltage with the port configured for input and assigning the measured value to $M_{K+1}$; comparing $M_{K+1}$ with $M_K$; continuing to repeat the steps when $M_{K+1}=M_K$; and ending the repeating of the steps when $M_{K+1}$ is not equal to $M_K$; wherein, when all measurements $M_1$ to $M_N$ are equal, the resulting value of the conversion is equal to $M_1$ when $M_1$ is less than or equal to the mid-point of the analog to digital converter operating range, and the resulting value of the conversion is equal to $M_1+(N-1)\Delta_C$ when $M_1$ is greater than the mid-point of the analog to digital converter operating range; and wherein, when $M_{K+1}$ is not equal to $M_K$, the resulting value of the conversion is equal to $M_1+(N-K)\Delta_C$ when $M_1$ is less than or equal to the mid-point of the analog to digital converter operating range, and the resulting value of the conversion is equal to $M_1+(K-1)\Delta_C$ when $M_1$ is greater than the mid-point of the analog to digital converter operating range.

Other aspects and features of the present invention will become apparent to those ordinarily skilled in the art or science to which it pertains upon review of the following description of specific embodiments of the invention in conjunction with the accompanying figures.

BRIEF DESCRIPTION OF DRAWINGS

The present invention will be described in conjunction with drawings in which:

FIGS. 3A to D are schematic illustrations of an exemplary embodiment of a method for increasing the resolution of analog to digital conversion.

DETAILED DESCRIPTION

Figure 1:
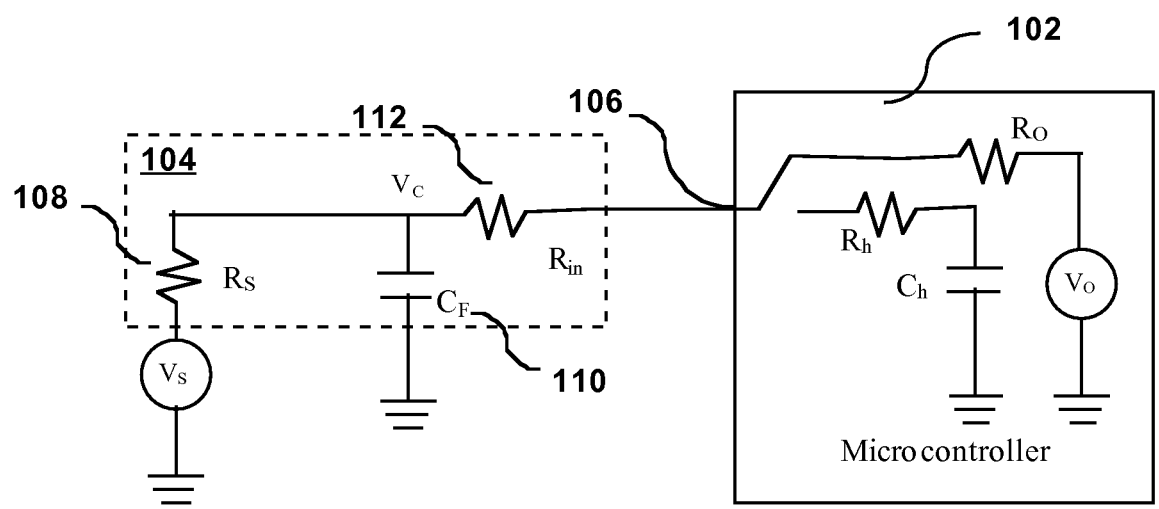
FIG. 1 is a schematic representation of an exemplary microcontroller, having an A/D converter, and a RC network connected to an I/O port of the A/D converter for use with a method for increasing the resolution of A/D conversion.

FIG. 1 is a schematic representation of an exemplary microcontroller 102, having an A/D converter, and a RC network (i.e. circuit) 104 connected to an input/output (I/O) port 106 of the A/D converter for use with a method for increasing the resolution of A/D conversion. The normal function of an A/D conversion circuit is to sense an external voltage ($V_S$), with some source resistance ($R_S$) 108, and typically filtered using a filter capacitor ($C_F$) 110 to remove any noise superimposed on the signal.

A second resistor ($R_{IN}$) 112 is added in the RC network 104 to take advantage of the I/O port 106 capability of the microcontroller 102 to increase the sensitivity of the A/D conversion.

When the I/O port 106 is activated as an output and driven high the RC network 104 allows the voltage at the capacitor 110 to increase gradually (as a well known function of the values of $R_S$, $R_{IN}$ and $C_F$). By controlling the time (T) that the output is driven high, the increase in the voltage at the capacitor can be controlled. Alternatively, by driving the output low, the voltage at the capacitor can be decreased in a similarly controlled fashion.

To support many different applications, most microcontrollers allow the analog input ports to also be configured as outputs. In an alternative embodiment, the method for increasing the resolution of A/D conversion can also be applied when separate microcontroller output and input ports are interconnected and connected to the RC network 104.

Figure 2:
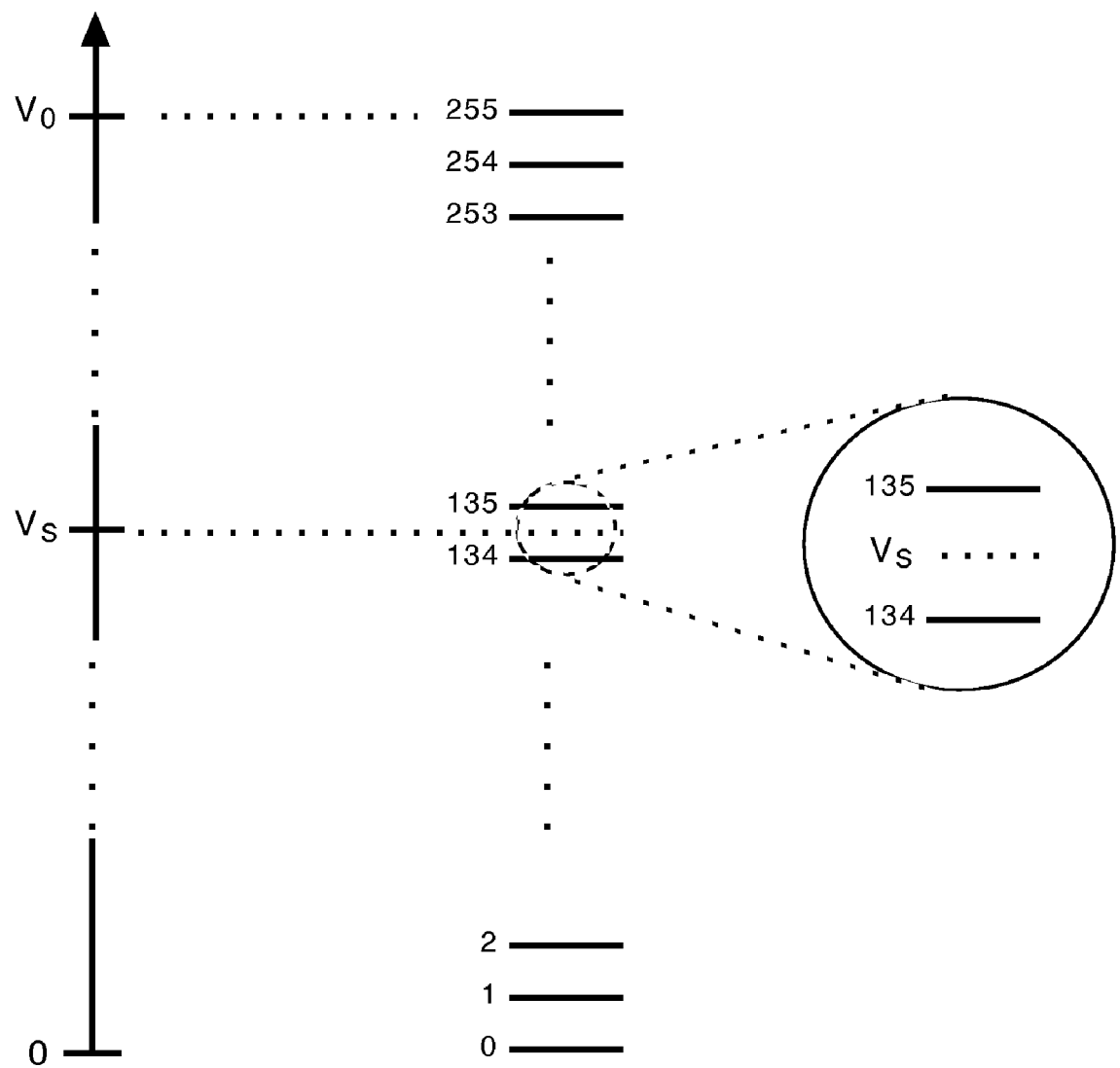
FIG. 2 is a schematic representation of an exemplary measurement taken using an 8-bit A/D converter.

An A/D converter can resolve the sensed voltage into a fixed number of steps, depending on the converter's native resolution. For example, an 8-bit A/D converter can resolve 256 distinct values (i.e. steps) between 0 and a reference voltage. For example, when the reference voltage is 5V, the 8-bit A/D converter can resolve steps of 19.53 mV. The actual sense voltage to be converted is typically in between two steps of the A/D converter's resolution, and typically is measured as equal to the step below the actual value. FIG. 2 is a schematic representation of an exemplary measurement taken using an 8-bit A/D converter. The A/D converter can resolve 256 steps (numbered 0-255) between 0 and the reference voltage ($V_O$). The sense voltage to be converted ($V_S$) falls between two steps of the A/D converter's resolution (in the illustrated example between steps 134 and 135) and would typically be measured as equal to the step below (in the illustrated example step 134). In the exemplary illustration with a reference voltage ($V_O$) equal to 5V, the sense voltage ($V_S$) would be measured (i.e. converted) as 19.53 mV×134=2.61702V.

FIGS. 3A to D are schematic illustrations of an exemplary method for increasing the resolution of A/D conversion. By using the microcontroller port to modify the sense voltage $V_S$ by increments (i.e. steps) that are a fraction (1/N) of a native step of the A/D converter to become a modified voltage $V_C$, it is possible to increase the effective resolution of the A/D conversion. The effective resolution is increased by the number (N) of fractional steps (i.e. the desired resolution step size)

Referring to FIG. 3A, the method includes first measuring the nominal voltage of the sense voltage $V_S$ with the microcontroller port programmed as an analog input port. The resulting measurement (i.e. conversion) is $M_1$. In the illustrated example, $V_S$ falls between steps 134 and 135 of the A/D converter's resolution and therefore $M_1$ is given the value 134.

Referring to FIG. 3B, the microcontroller port is then programmed as an output and driven high (or alternatively low) for a period of time, $T_1$, to modify the sense voltage $V_S$ by an amount equal to the desired factional step size ($\Delta_C$) (i.e. the native resolution step size of the A/D converter, divided by N). After time $T_1$, the microcontroller port is switched back to an analog input and the modified voltage $V_C$ is immediately measured with the A/D converter. This results in measurement M2. In the illustrated example, $V_C$ falls between steps 134 and 135 of the A/D converter's resolution and therefore $M_2$ is given the value 134.

Because the nominal voltage (M1) was likely between two native A/D converter resolution steps, the fractional increase (or decrease) to the voltage (i.e. the modified voltage) may have reached the next step and the A/D converter measurement may have changed (i.e. measurement $M_2$ may be different from measurement $M_1$). A check is made to determine if the current measurement is different from the immediately previous measurement.

When measurement $M_2$ is different than measurement $M_1$, it is now known that the nominal voltage is equal to one fractional step below (or above) measurement $M_2$.

Referring to FIG. 3C, when measurement $M_2$ is equal to measurement $M_1$, the microcontroller port can be configured as an output and driven high (or low) for a longer period of time $T_2$, to change the voltage by two fractional steps. The microcontroller port is then configured as an analog input again and the modified voltage is immediately measured resulting in measurement $M_3$. When measurement $M_3$ is different from measurements $M_1$ and $M_2$, then it is known that the nominal voltage was equal to two fractional steps below (or above) measurement $M_3$. In the illustrated example, $V_C$ falls between steps 134 and 135 of the A/D convert resolution and therefore $M_3$ is given the value 134.

This procedure can be repeated to create up to N measurements, covering the full range of fractional steps between two adjacent native A/D converter resolution steps. The measurement results are $M_2$ to $M_N$ and the microcontroller port output drive times are $T_1$ to $T_{N-1}$.

When all measurements yield the same value and the fractional steps are positive (i.e. the output port was driven high), the measured sensed voltage $V_S$ is equal to measurement $M_1$. When all measurements yield the same value and the fractional steps are negative (i.e. the output port was driven low) the measured sensed voltage $V_S=M_1+(N-1)\times\Delta_C$.

Referring to FIG. 3D, in the illustrated example the value of $V_C$ exceeds 135 on the $K^{th}$ iteration of the method and $M_{K+1}$ is given the value 135. In this case, the measured value $V_S=M_1+(N-K)\times\Delta_C$, when the fractional steps are positive, and alternatively $V_S=M_1+(K-1)\times\Delta_C$, when the fractional steps are negative.

Figure 4:
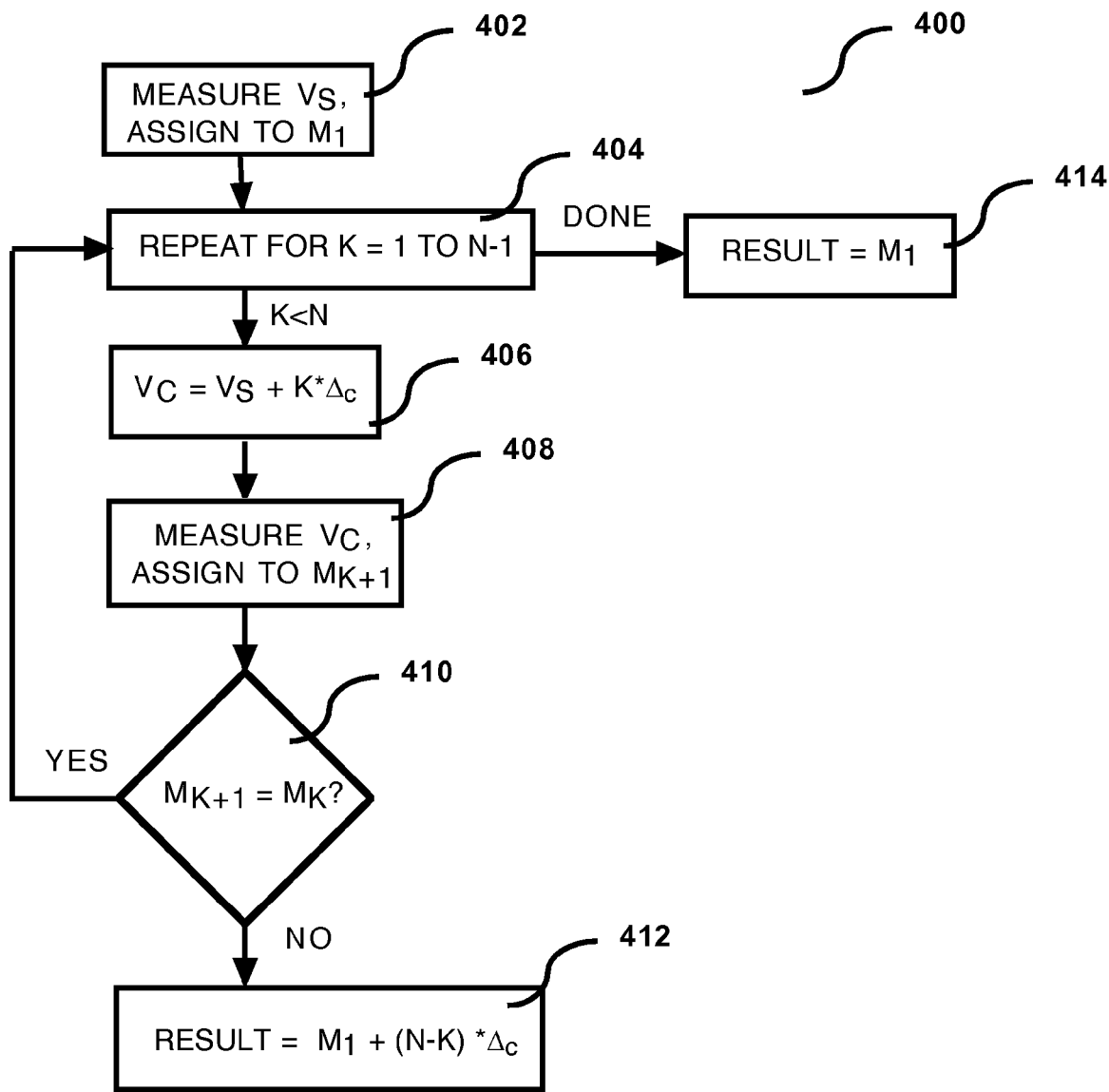
FIG. 4 is a flowchart representation of the steps in a first exemplary embodiment of the method for increasing the resolution of analog to digital conversion.

FIG. 4 is a flowchart representation of the steps in a first exemplary embodiment of the method 400 for increasing the resolution of analog to digital conversion. The method begins 402 with the measuring of the sense voltage $V_S$ and assigning the measured value to $M_1$. In step 404, K is given the values 1 to N−1 for successive iterations of the following steps. Where 1/N is the fractional size of the desired resolution step size relative to the native resolution steps size of the A/D converter. Step 406 is repeated for successive values of K, the I/O port is programmed as an output and driven high (or alternatively low) for a period of time, $T_K$, to modify the sense voltage $V_S$ by an amount equal to K times the desired fractional step size $\Delta_C$. The desired fractional step size $\Delta_C$ is the native resolution step size of the A/D converter, divided by N. Step 408 is repeated for successive values of K, after time $T_K$, the microcontroller port is switched back to an analog input and the modified voltage $V_C$ is immediately measured with the A/D converter and the measurement is assigned to $M_{K+1}$. Step 410 is repeated for successive values of K, a check is made to determine if the current measure $M_{K+1}$ is equal to the immediately previous measurement $M_K$. When $M_{K+1}$ is equal to MK the method continues with step 404. When $M_{K+1}$ is not equal to $M_K$ the resulting measurement, in step 412, is that $V_S=M_1+(N-K)\times\Delta_C$, when the fractional steps are positive, and alternatively $V_S=M_1+(K-1)\times\Delta_C$, when the fractional steps are negative. When steps 404 through 410 have been repeated for all of the values of K up to and including N−1 and each of the measurements $M_2$ to $M_{K+1}$ are equal to $M_1$, the resulting measurement, in step 414, is $V_S=M_1$.

Figure 5:
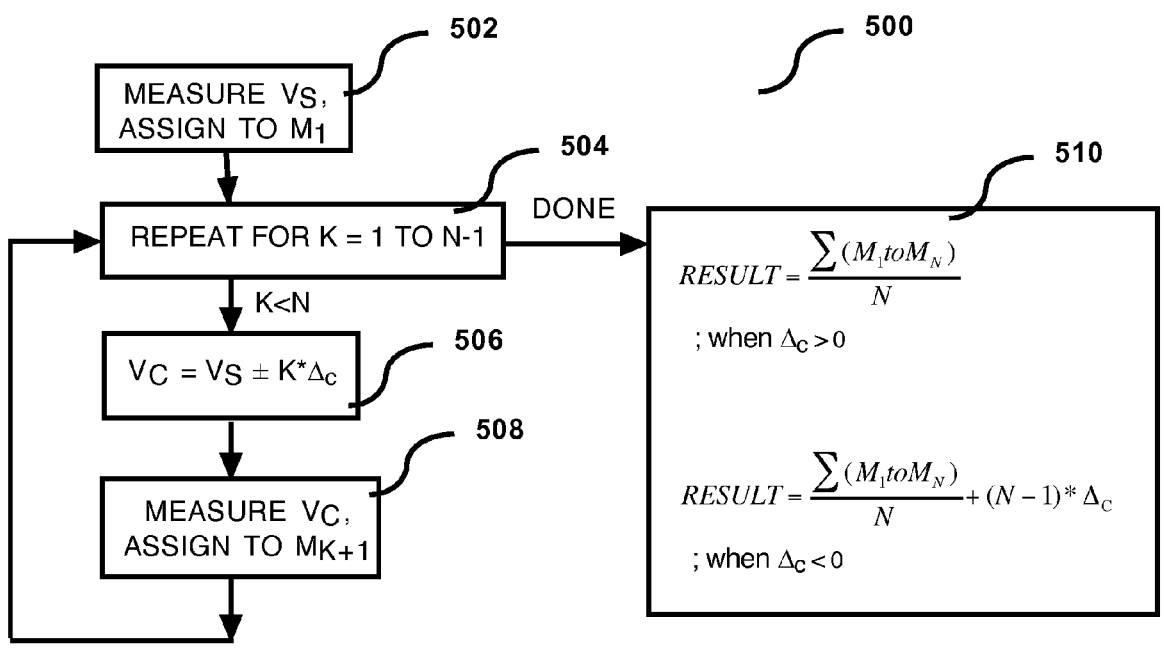
FIG. 5 is a flowchart representation of the steps in a second exemplary embodiment of the method for increasing the resolution of analog to digital conversion.

FIG. 5 is a flowchart representation of the steps in a second exemplary embodiment of the method 500 for increasing the resolution of analog to digital conversion. The method begins in step 502 with the measuring of the sense voltage $V_S$ and assigning the measured value to $M_1$. In step 504, K is given the values 1 to N−1 for successive iterations of the following steps. Where 1/N is the fractional size of the desired resolution step size relative to the native resolution steps size of the A/D converter. Step 506 is repeated for successive values of K, the I/O port is then programmed as an output and driven high (or alternatively low) for a period of time, $T_1$, to modify the sense voltage $V_S$ by an amount equal to K times the desired factional step size $\Delta_C$. The desired fractional step size $\Delta_C$ is the native resolution step size of the A/D converter, divided by N. Step 508 is repeated for successive values of K, after time $T_1$, the microcontroller port is switched back to an analog input and the modified voltage $V_C$ is immediately measured with the A/D converter and the measurement is assigned to $M_{K+1}$. When steps 504 through 508 have been repeated for all values of K up to and including N−1, in step 510 the resulting measurement is that $V_S=\Sigma(M_1$ to $M_N)/N$, when the fractional steps are positive, and alternatively $V_S=\Sigma(M_1$ to $M_N)/N+(N-1)\Delta_C$, when the fractional steps are negative.

In another alternative embodiment of the method all of the N measurements as described above can be performed and the resulting measurements summed (i.e. added together). When the voltage is increased with each measurement, the final sum is the result of the conversion expressed as a number of fractional steps. For example, using a microcontroller with an 8-bit A/D converter (i.e. 256 native steps), the sum of measurements from 12 fractional steps will be a number between 0 and 3060.

When the voltage is decreased with each measurement, the final sum plus (N−1) is the result of the conversion expressed as a number of fractional steps. For example, using a microcontroller with an 8-bit A/D converter (i.e. 256 native steps), the sum of measurements from 12 fractional steps will be a number between 0 and 3060. Adding 11 (i.e. N−1) to this number gives a resulting number between 11 and 3071.

The preceding example illustrates how using an increasing modified voltage inaccurately represents the high end of the range (i.e. the result is limited to 3060 when up to 3071 should be possible), and using a decreasing modified voltage inaccurately represents the bottom end of the range (i.e. the result is limited to 11 when 0 should be possible).

When it is anticipated that the measured voltage could extend to the extremes (i.e. upper or lower limits) of the range of the A/D converter, then an alternative embodiment of the method can be used to avoid inaccurate measurements at the extremes of the A/D converter range. When measurement $M_1$ is greater than the midpoint of the A/D converter range, the microcontroller will modify the voltage by driving the output low (i.e. decreasing the modified voltage). When measurement $M_1$ is at or below the midpoint of the A/D converter range, the microcontroller will modify the voltage by driving the output high (i.e. increasing the modified voltage).

Figure 6:
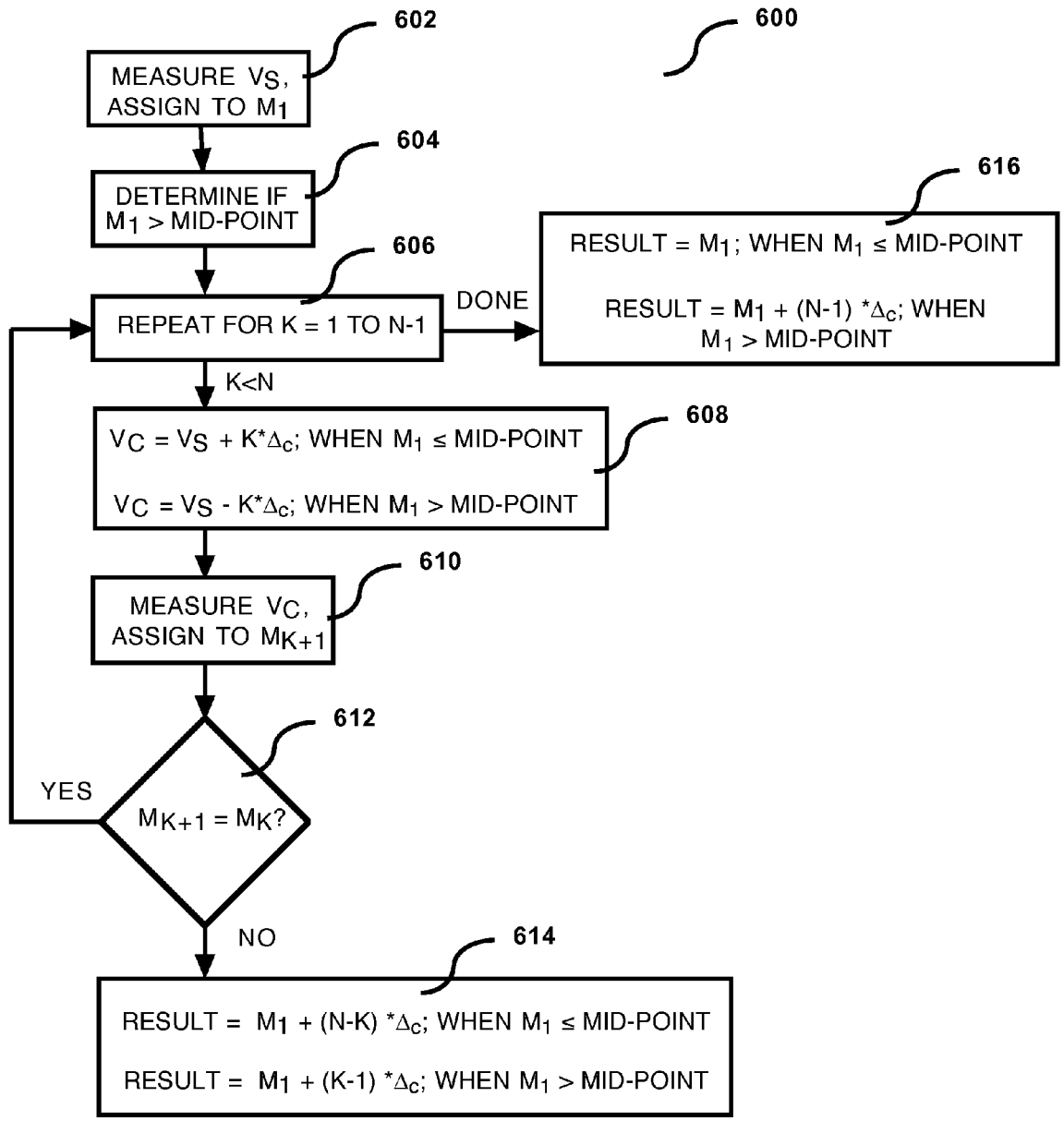
FIG. 6 is a flowchart representation of the steps in a third exemplary embodiment of the method for increasing the resolution of analog to digital conversion.

FIG. 6 is a flowchart representation of the steps in a third exemplary embodiment of the method 600 for increasing the resolution of analog to digital conversion. The method begins in step 602 with the measuring of the sense voltage $V_S$ and assigning the measured value to $M_1$. A check is made 604 to determine if the measured value $M_1$ is greater than the midpoint of the A/D converter's measurement range (i.e. $V_O/2$). In step 606, K is given the values 1 to N−1 for successive iterations of the following steps. Where i/N is the fractional size of the desired resolution step size relative to the native resolution step size of the A/D converter. Step 608 is repeated for successive values of K, the I/O port is programmed as an output and driven low, when $M_1>$ the mid-point, or alternatively driven high, when $M_1<=$ the mid-point, for a period of time, $T_K$, to modify the sense voltage $V_S$ by an amount equal to K times the desired factional step size $\Delta_C$. The desired fractional step size $\Delta_C$ is the native resolution step size of the A/D converter, divided by N. Step 610 is repeated for successive values of K, after time $T_K$, the microcontroller port is switched back to an analog input and the modified voltage $V_C$ is immediately measured with the A/D converter and the measurement is assigned to $M_{K+1}$. Step 612 is repeated for successive values of K, a check is made to determine if current the measurement $M_{K+1}$ is equal to the immediately previous measurement $M_K$. When $M_{K+1}$ is equal to $M_K$ the method continues with step 606. When $M_{K+1}$ is not equal to $M_K$ the resulting measurement is, in step 614, that $V_S = M_1 + (N-K) \times \Delta_C$, when $M_1 <=$ the mid-point of the A/D converter's measurement range, and alternatively $V_S = M_1 + (K-1) \times \Delta_C$, when $M_1 >$ the mid-point of the A/D converter's measurement range. When steps 606 through 612 have been repeated for all of the values of K up to and including N−1, and each of the measurements $M_2$ to $M_{K+1}$ are equal to $M_1$, the resulting measurement, in step 616, is $V_S = M_1$. when $M_1 <=$ the mid-point of the A/D converter's measurement range, and alternatively $V_S = M_1 + (N-1) \times \Delta_C$, when $M_1 >$ the mid-point of the A/D converter's measurement range.

Referring again to the RC network 104 of FIG. 1, there are several time parameters that can be engineered with respect to the method. Calculations for these time parameters and preferred relationships between the parameters are described below, where $V_S$ is the sense voltage (i.e. the voltage to be converted), $V_C$ is the modified voltage, and $V_O$ is the reference voltage for the A/D converter.

$\tau_s$ is the time constant that determines the rate of change of $|V_C - V_S|$ when the microcontroller port is configured as an analog input. $\tau_S = R_S \times C_F$.

$\tau_{in}$ is the time constant that determines the rate of change of $|V_O - V_C|$ when the microcontroller port is configured as an output. For the exemplary RC network 104, $\tau_{in} = R_{in} \times C_F$ (assuming $R_O << R_{in}$, and $C_h << C_F$; at least by a factor of 10 in both cases).

$T_{acq}$ is the time from when the microcontroller port changes from being configured as an output to an analog input and the A/D conversion starts (i.e. the acquisition delay).

According to the method, the following relationships between these parameters are preferred. These relationships can be achieved via the selection of RC network 104 component values and via the programming of control logic (e.g. executable instructions) in the microcontroller 102.

$\tau_s >> T_{acq}$ (at least 10 times greater)

$\tau_{in} >> T_{N-1}$ (at least 10 times greater)

Also, the frequency with which measurements are taken and therefore the amount of time that the microcontroller port is configured as on output can affect the long-term average value of the modified voltage ($V_C$). This effect can be compensated for by applying an offset to the result or alternatively by adjusting the amount of time that the port is configured as an output as a fraction of the total period (i.e. time) between the start of two consecutive measurements.

The value of $R_{in}$ can also affect the minimum acceptable $T_{acq}$ as function of the make/model of microcontroller used and in particular of the RC equivalent values of the I/O port as represented by the values of $R_h$ and $C_h$.

The method according to the present invention can be implemented by a computer program product comprising computer executable instructions stored on a computer-readable storage medium.

It will be apparent to one skilled in the art that numerous modifications and departures from the specific embodiments described herein may be made without departing from the spirit and scope of the present invention.

The invention claimed is:

1. A method for increasing a resolution of an analog to digital conversion, using a microcontroller having an analog to digital converter and a configurable input/output port, a sense voltage to be converted is presented to the input/output port though a resistive-capacitive network, the resolution is increased to a desired resolution step size $\Delta_c$ equal to a fraction 1/N of a native resolution step size of the analog to digital converter, the method comprising steps of:
   a) measuring the sense voltage with the configurable input/output port configured for input and assigning the measured sense voltage value to $M_1$;
   b) repeating for K=1 to N−1 steps c) to g):
      c) modifying the sense voltage by driving the configurable input/output port to a high voltage, with the configurable input/output port configured for output, for a period of time determined to modify the sense voltage by an amount equal to K times the desired resolution step size $\Delta_c$;
      d) measuring the modified sense voltage with the configurable input/output port configured for input and assigning the measured sense voltage value to $M_{K+1}$;
      e) comparing $M_{K+1}$ with $M_K$;
      f) continuing to repeat the steps c) to g) when $M_{K+1} = M_K$; and
      g) ending the repeating of the steps c) to g) when $M_{K+1}$ is not equal to $M_K$; wherein a resulting value of the conversion is equal to $M_1$ when all measurements $M_1$ to $M_N$ are equal; and the resulting value of the conversion is equal to $M_1 + (N-K) \Delta_c$ when $M_{K+1}$ is not equal to $M_K$.

2. The method of claim 1, wherein the sense voltage is modified by driving the port to a low voltage; and wherein the resulting value of the conversion is equal to $M_1$ when all measurements $M_1$ to $M_N$ are equal; and the resulting value of the conversion is equal to $M_1 + (K-1) \times \Delta_c$ when $M_{K+1}$ is not equal to $M_K$.

3. A method for increasing a resolution of an analog to digital conversion, using a microcontroller having an analog to digital converter and a configurable input/output port, a sense voltage to be converted is presented to the input/output port though a resistive-capacitive network, the resolution is increased to a desired resolution step size $\Delta_c$ equal to a fraction 1/N of a native resolution step size of the analog to digital converter, the method comprising steps of:
   a) measuring the sense voltage with the configurable input/output port configured for input and assigning the measured sense voltage value to $M_1$;
   b) repeating for K=1 to N−1 c) to d):
      c) modifying the sense voltage by driving the configurable input/output port to a high voltage, with the configurable input/output port configured for output, for a period of time determined to modify the sense voltage by an amount equal to K times the desired resolution step size $\Delta_c$;
      d) measuring the modified sense voltage with the configurable input/output port configured for input and assigning the measured value to $M_{K+1}$;
   wherein a resulting value of the conversion is equal to $\Sigma(M_1 \text{ to } M_N)/N$.

4. The method of claim 3, wherein the sense voltage is modified by driving the port to a low voltage; and wherein the resulting value of the conversion is equal to $\Sigma(M_1 \text{ to } M_N)/N + (N-1)\Delta_c$.

5. A method for increasing a resolution of an analog to digital conversion, using a microcontroller having an analog to digital converter and a configurable input/output port, a sense voltage to be converted is presented to the input/output port though a resistive-capacitive network, the resolution is increased to a desired resolution step size $\Delta_c$ equal to a fraction 1/N of a native resolution step size of the analog to digital converter, the method comprising steps of:

a) measuring the sense voltage with the configurable input/output port configured for input and assigning the measured sense voltage value to $M_1$;

b) determining that $M_1$ is one of: less than or equal to a mid-point of the analog to digital converter operating range; and greater than the mid-point of the analog to digital converter operating range;

c) repeating for K=1 to N−1 steps d to i):

d) when $M_1$ is less than or equal to the mid-point of the analog to digital converter operating range, modifying the sense voltage by driving the configurable input/output port to a high voltage, with the configurable input/output port configured for output, for a period of time determined to modify the sense voltage by an amount equal to K times the desired resolution step size $\Delta_c$;

e) when $M_1$ is greater than the mid-point of the analog to digital converter operating range, modifying the sense voltage by driving the configurable input/output port to a low voltage, with the configurable input/output port configured for output, for a period of time determined to modify the sense voltage by an amount equal to K times the desired resolution step size $\Delta_c$;

f) measuring the modified sense voltage with the configurable input/output port configured for input and assigning the measured sense voltage value to $M_{K+1}$;

g) comparing $M_{K+1}$ with $M_K$;

h) continuing to repeat the steps d) to i) when $M_{K+1}=M_K$; and i) ending the repeating of the steps d) to i) when $M_{K+1}$ is not equal to $M_K$;

wherein, when all measurements $M_1$ to $M_N$ are equal, a resulting value of the conversion is equal to $M_1$ when $M_1$ is less than or equal to the mid-point of the analog to digital converter operating range, and the resulting value of the conversion is equal to $M_1+(N-1)\Delta_c$ when $M_1$ is greater than the mid-point of the analog to digital converter operating range; and wherein, when $M_{K+1}$ is not equal to $M_K$, the resulting value of the conversion is equal to $M_1+(N-K)\Delta_c$ when $M_1$ is less than or equal to the mid-point of the analog to digital converter operating range, and the resulting value of the conversion is equal to $M_{1+(K-1)}\Delta_c$ when $M_1$ is greater than the mid-point of the analog to digital converter operating range.

6. The method of any of claims 1 to 5, wherein the microcontroller has a separate input port and an output port; and further the output port is used in the step of modifying the sense voltage and the input port is used in the step of measuring the the modified sense voltage.

* * * * *